(12) United States Patent
Zhang et al.

(10) Patent No.: US 12,058,883 B2
(45) Date of Patent: Aug. 6, 2024

(54) LIGHT-EMITTING DEVICE AND MANUFACTURING METHOD THEREOF, DISPLAY PANEL AND DISPLAY DEVICE

(71) Applicant: BOE TECHNOLOGY GROUP CO., LTD., Beijing (CN)

(72) Inventors: Zhihui Zhang, Beijing (CN); Yan Fan, Beijing (CN); Hao Gao, Beijing (CN); Xing Fan, Beijing (CN)

(73) Assignee: BOE TECHNOLOGY GROUP CO., LTD., Beijing (CN)

( * ) Notice: Subject to any disclaimer, the term of this patent is extended or adjusted under 35 U.S.C. 154(b) by 334 days.

(21) Appl. No.: 17/509,760

(22) Filed: Oct. 25, 2021

(65) Prior Publication Data

US 2022/0302416 A1   Sep. 22, 2022

(30) Foreign Application Priority Data

Mar. 19, 2021   (CN) .......................... 202110294954.8

(51) Int. Cl.
| | | |
|---|---|---|
| H01L 51/52 | (2006.01) | |
| H01L 51/56 | (2006.01) | |
| H10K 50/15 | (2023.01) | |
| H10K 50/852 | (2023.01) | |
| H10K 71/00 | (2023.01) | |
| H10K 102/00 | (2023.01) | |

(52) U.S. Cl.
CPC ......... *H10K 50/852* (2023.02); *H10K 50/156* (2023.02); *H10K 71/00* (2023.02); *H10K 2102/351* (2023.02)

(58) Field of Classification Search
CPC ...................... H10K 50/156; H10K 2102/351
See application file for complete search history.

(56) References Cited

U.S. PATENT DOCUMENTS

| | | | | |
|---|---|---|---|---|
| 2008/0252206 | A1* | 10/2008 | Ryu ...................... | H10K 50/852 |
| | | | | 445/24 |
| 2014/0117315 | A1* | 5/2014 | Kim ...................... | H10K 50/156 |
| | | | | 257/89 |
| 2016/0133674 | A1* | 5/2016 | Lee ........................ | H10K 59/353 |
| | | | | 257/40 |
| 2019/0363138 | A1* | 11/2019 | Jo ............................. | G09F 9/30 |
| 2020/0328381 | A1* | 10/2020 | Ushikubo ............... | H10K 59/12 |
| 2021/0134895 | A1* | 5/2021 | Wang ..................... | H01L 27/156 |

(Continued)

*Primary Examiner* — Victoria K. Hall
(74) *Attorney, Agent, or Firm* — DINSMORE & SHOHL LLP

(57) ABSTRACT

Provided are a light-emitting device and a manufacturing method thereof, a display panel and a display device. The light-emitting device includes a plurality of light-emitting units including a first, a second, and a third light-emitting unit. Each light-emitting unit includes a micro-cavity structure including an anode, a hole transport layer, a functional layer, and a cathode. The functional layer of the first light-emitting unit includes a first light-emitting layer, a first buffer layer between the first light-emitting layer and the hole transport layer of the first light-emitting unit, and a second buffer layer between the first buffer layer and the first light-emitting layer. The material of the second buffer layer is different from that of the first buffer layer, the second buffer layer has a physical thickness less than or equal to 30 nanometers and an optical thickness less than or equal to 60 nanometers.

19 Claims, 4 Drawing Sheets

(56) References Cited

U.S. PATENT DOCUMENTS

2023/0320130 A1\* 10/2023 Watabe ............... H10K 50/858
                                                              257/40
2024/0057368 A1\* 2/2024 Hao ..................... H10K 71/60

\* cited by examiner

LIGHT-EMITTING DEVICE AND MANUFACTURING METHOD THEREOF, DISPLAY PANEL AND DISPLAY DEVICE

CROSS-REFERENCE TO RELATED APPLICATIONS

The present disclosure is based on and claims priority to China Patent Application No. 202110294954.8 filed on Mar. 19, 2021, the disclosure of which is incorporated by reference herein in its entirety.

TECHNICAL FIELD

The present disclosure relates to a light-emitting device and a manufacturing method thereof, a display panel and a display device.

BACKGROUND

The organic light-emitting diode (OLED) comprises a type of top-emitting OLED (TOLED) and a type of bottom-emitting OLED (BOLED).

Compared with BOLED, TOLED has higher luminous efficiency and better color purity, and thus has broad development prospects.

SUMMARY

According to one aspect of the embodiments of the present disclosure, provided is a light-emitting device. The light-emitting device comprises the plurality of light-emitting units comprising a first light-emitting unit, a second light-emitting unit, and a third light-emitting unit. Each of the plurality of light-emitting units comprises a micro-cavity structure which comprises: an anode, a hole transport layer located on one side of the anode, a functional layer located on one side of the hole transport layer away from the anode, and a cathode located on one side of the functional layer away from the hole transport layer. The functional layer of the first light-emitting unit comprises: a first light-emitting layer, a first buffer layer located between the first light-emitting layer and the hole transport layer of the first light-emitting unit, and a second buffer layer located between the first buffer layer and the first light-emitting layer, wherein a material of the second buffer layer is different from that of the first buffer layer, a physical thickness of the second buffer layer is less than or equal to 30 nanometers, and an optical thickness of the second buffer layer is less than or equal to 60 nanometers.

In some embodiments, the functional layer of the second light-emitting unit comprises: a second light-emitting layer; a third buffer layer located between the second light-emitting layer and the hole transport layer of the second light-emitting unit; and a fourth buffer layer located between the third buffer layer and the second light-emitting layer, wherein a material of the fourth buffer layer is different from that of the third buffer layer, a physical thickness of the fourth buffer layer is less than or equal to 30 nanometers, and an optical thickness of the fourth buffer layer is less than or equal to 60 nanometers.

In some embodiments, a material of the hole transport layer is the same as that of at least one of the first buffer layer or the third buffer layer.

In some embodiments, the physical thickness of at least one of the second buffer layer or the fourth buffer layer is greater than or equal to 5 nanometers.

In some embodiments, the functional layer of the third light-emitting unit comprises: a third light-emitting layer; and a fifth buffer layer located between the third light-emitting layer and the hole transport layer of the third light-emitting unit.

In some embodiments, the fifth buffer layer is in contact with the third light-emitting layer, and in contact with the hole transport layer of the third light-emitting unit.

In some embodiments, a material of the fifth buffer layer is the same as that of the hole transport layer.

In some embodiments, a refractive index of the hole transport layer ranges from 1.4 to 2.2.

In some embodiments, the refractive index of the hole transport layer ranges from 1.4 to 1.8.

In some embodiments, thicknesses of the functional layer of the first light-emitting unit, the functional layer of the second light-emitting unit and the functional layer of the third light-emitting unit are different from each other, such that thicknesses of the micro-cavity structure in the first light-emitting unit, the micro-cavity structure in the second light-emitting unit and the micro-cavity structure in the third light-emitting unit are different from each other.

In some embodiments, the micro-cavity structure further comprises: an electron transport layer located between the functional layer and the cathode.

In some embodiments, the first light-emitting unit is one of a red light-emitting unit and a green light-emitting unit, the second light-emitting unit is the other of the red light-emitting unit and the green light-emitting unit, and the third light-emitting unit is a blue light-emitting unit.

In some embodiments, an absolute value of a difference between a band gap of the first buffer layer and a band gap of the second buffer layer is a first value, an absolute value of a difference between a band gap of the third buffer layer and a band gap of the fourth buffer layer is a second value, and at least one of the first value or the second value is less than or equal to 0.2 eV.

In some embodiments, a material of the second buffer layer is the same as that of the fourth buffer layer.

In some embodiments, a material of each of the first buffer layer, the second buffer layer, the third buffer layer, and the fourth buffer layer comprises an organic material.

In some embodiments, a material of the fifth buffer layer comprises an organic material.

In some embodiments, the organic material comprises an aromatic compound.

According to another aspect of the embodiments of the present disclosure, provided is a display panel comprising a plurality of pixel units, wherein each of the plurality of pixel units comprises the light-emitting device according to any one of the above embodiments.

According to still another aspect of the embodiments of the present disclosure, provided is a display device comprising the display panel any one of the above embodiments.

According to yet still another aspect of the embodiments of the present disclosure, provided is a manufacturing method of a light-emitting device comprising forming a plurality of light-emitting units. The plurality of light-emitting units comprises a first light-emitting unit, a second light-emitting unit, and a third light-emitting unit, each of the plurality of light-emitting units comprising a micro-cavity structure. Forming the micro-cavity structure comprises: forming an anode; forming a hole transport layer on one side of the anode; forming a functional layer on one side of the hole transport layer away from the anode; and forming a cathode on one side of the functional layer away from the hole transport layer. Forming the functional layer of the first light-emitting unit comprises: forming a first buffer layer; forming a second buffer layer on one side of the first buffer layer away from the hole transport layer of the first light-emitting unit, wherein a material of the second buffer layer is different from that of the first buffer layer, a physical thickness of the second buffer layer is less than or equal to 30 nanometers, and an optical thickness of the second buffer layer is less than or equal to 60 nanometers; and forming a first light-emitting layer on one side of the second buffer layer away from the hole transport layer of the first light-emitting unit.

Other features, aspects and advantages of the present disclosure will become apparent from the following detailed description of exemplary embodiments of the present disclosure with reference to the accompanying drawings.

BRIEF DESCRIPTION OF THE DRAWINGS

The accompanying drawings, which constitute part of this specification, illustrate exemplary embodiments of the present disclosure and, together with this specification, serve to explain the principles of the present disclosure.

The present disclosure may be more clearly understood from the following detailed description with reference to the accompanying drawings, in which.

Figure 1A:
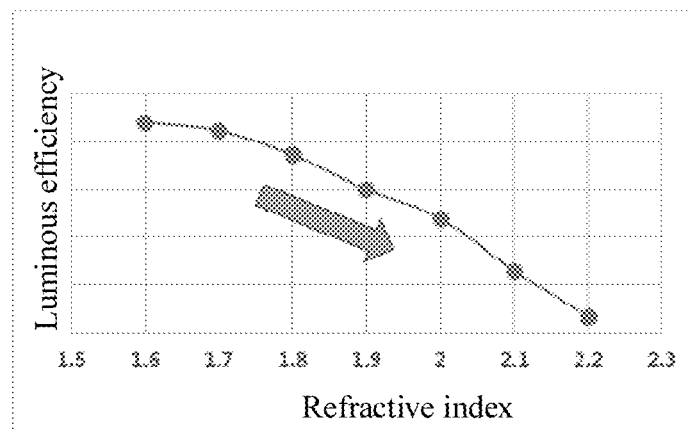
FIG. 1A is a schematic view showing the relationship between the luminous efficiency of the blue light-emitting unit and the refractive index of the hole transport layer.

It should be understood that the dimensions of various parts shown in the accompanying drawings are not necessarily drawn according to actual proportional relations. In addition, the same or similar components are denoted by the same or similar reference signs.

DETAILED DESCRIPTION

Various exemplary embodiments of the present disclosure will now be described in detail with reference to the accompanying drawings. The following description of the exemplary embodiments is merely illustrative and is in no way intended as a limitation to the present disclosure, its application or use. The present disclosure may be implemented in many different forms, which are not limited to the embodiments described herein. These embodiments are provided to make the present disclosure thorough and complete, and fully convey the scope of the present disclosure to those skilled in the art. It should be noticed that: relative arrangement of components and steps, material composition, numerical expressions, and numerical values set forth in these embodiments, unless specifically stated otherwise, should be explained as merely illustrative, and not as a limitation.

The use of the terms "first", "second" and similar words in the present disclosure do not denote any order, quantity or importance, but are merely used to distinguish between different parts. A word such as "comprise", "have" or variants thereof means that the element before the word covers the element(s) listed after the word without excluding the possibility of also covering other elements. The terms "up", "down", or the like are used only to represent a relative positional relationship, and the relative positional relationship may be changed correspondingly if the absolute position of the described object changes.

In the present disclosure, when it is described that a specific component is disposed between a first component and a second component, there may be an intervening component between the specific component and the first component or between the specific component and the second component. When it is described that a specific part is connected to other parts, the specific part may be directly connected to the other parts without an intervening part, or not directly connected to the other parts with an intervening part.

Unless otherwise defined, all terms (including technical and scientific terms) used herein have the same meanings as the meanings commonly understood by one of ordinary skill in the art to which the present disclosure belongs. It should also be understood that terms as defined in general dictionaries, unless explicitly defined herein, should be interpreted as having meanings that are consistent with their meanings in the context of the relevant art, and not to be interpreted in an idealized or extremely formalized sense.

Techniques, methods, and apparatus known to those of ordinary skill in the relevant art may not be discussed in detail, but where appropriate, these techniques, methods, and apparatuses should be considered as part of this specification.

Due to the limitation of the material of the light-emitting layer in the blue light-emitting unit, the blue light-emitting unit has a low light-emitting efficiency, thereby affecting the light-emitting efficiency of the white light of the light-emitting device comprising the blue light-emitting unit. Accordingly, the inventors seek to find a means of improving the luminous efficiency of the blue light-emitting unit.

First, by analyzing the relationship between the refractive index of the hole transport layer and the luminous efficiency of the blue light-emitting unit through a simulation software, the inventors have found that, the lower the refractive index of the hole transport layer is, the higher the luminous efficiency of the blue light-emitting unit will be, as shown in FIG. 1A.

Then, the inventors have verified through experiments that the luminous efficiency of the blue light-emitting unit can be improved by reducing the refractive index of the hole transport layer.

Table 1 shows the luminous efficiency of the blue light-emitting unit under different conditions.

TABLE 1

| Conditions | Ordinate of the color coordinate (CIEy) | Abscissa of the color coordinate (CIEx) | Luminous efficiency |
|---|---|---|---|
| Condition 1 | 0.043 | 0.140 | 105.20% |
| Condition 2 | 0.044 | 0.141 | 100% |

In Table 1, the refractive index of the hole transport layer under Condition 1 is smaller than that of the hole transport layer under Condition 2. It can be seen from Table 1 that, the luminous efficiency of the blue light-emitting unit under Condition 1 is greater than that of the blue light-emitting unit under Condition 2.

Figure 1B:
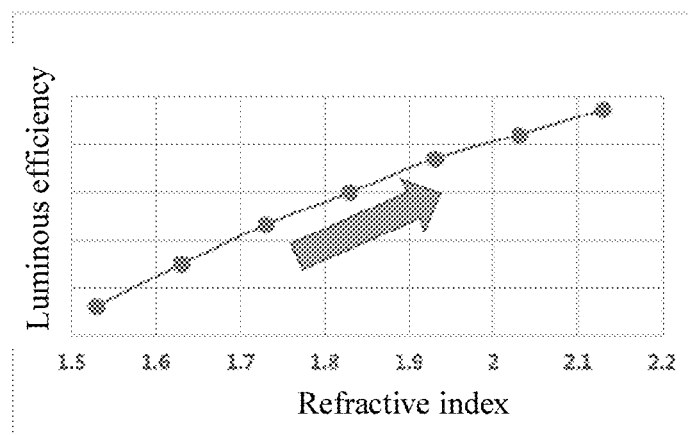
FIG. 1B is a schematic view showing the relationship between the luminous efficiency of the green light-emitting unit and the refractive index of the hole transport layer.
Figure 1C:
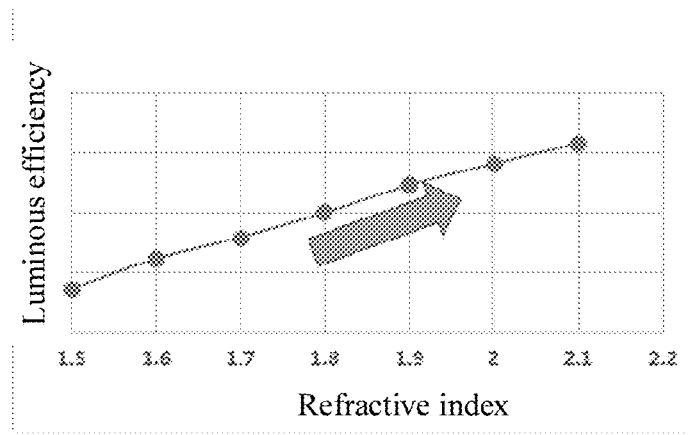
FIG. 1C is a schematic view showing the relationship between the luminous efficiency of the red light-emitting unit and the refractive index of the hole transport layer.

However, through further study, the inventors have found that, since the hole transport layers in different light-emitting units are formed by a same process (for example, an evaporation process), when the refractive index of the hole transport layer decreases, on the contrary, the luminous efficiency of the red light-emitting unit and the luminous efficiency of the green light-emitting unit will decrease to different extents, as shown in FIGS. 1B and 1C. It can be seen that when the refractive index of the hole transport layer decreases, it is not favorable for improving the luminous efficiency of the white light of the light-emitting device.

Through further study, the inventors have found that by adjusting the material, physical thickness, and optical thickness of certain layer(s) in the red light-emitting unit or the green light-emitting unit, even if the refractive index of the hole transport layer decreases, the luminous efficiency of at least one of the red light-emitting unit or the green light-emitting unit can be improved. In this way, in a case where the luminous efficiency of the blue light-emitting unit is improved, the luminous efficiency of at least one of the red light-emitting unit or the green light-emitting unit can also be improved, so that the luminous efficiency of the white light of the light-emitting device can be improved.

Through further study, the inventors have found that by adjusting the material, physical thickness, and optical thickness of certain layer(s) in a certain light-emitting unit, the efficiency of other light-emitting units can also be improved while the luminous efficiency of this light-emitting unit is improved, so that the luminous efficiency of the white light of the light-emitting device can be improved.

The light-emitting device will be described below in conjunction with different embodiments.

Figure 2A:
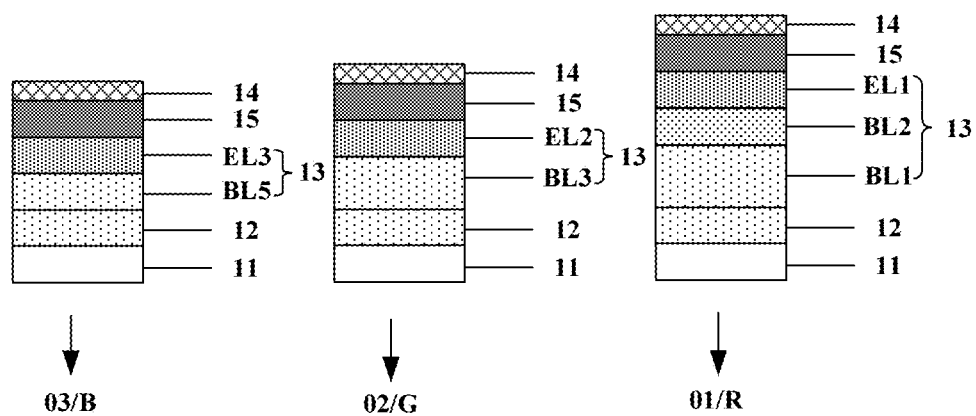
FIGS. 2A and 2B are schematic views showing the structure of the light-emitting device according to some embodiments of the present disclosure.
Figure 2B:
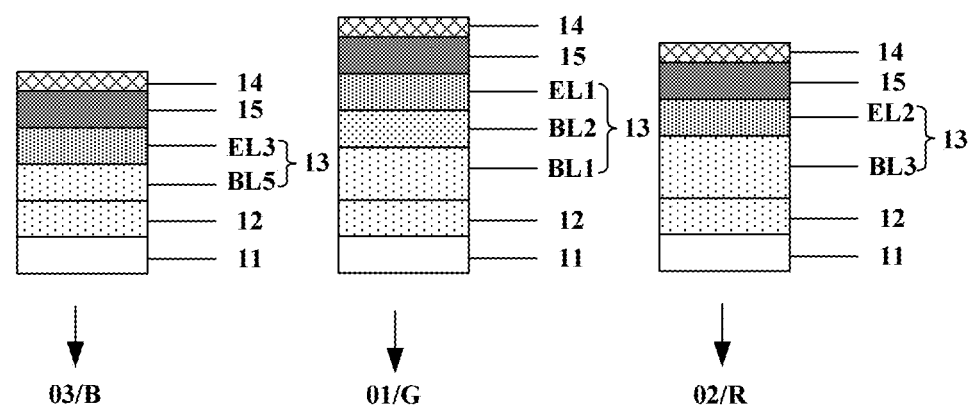

FIGS. 2A and 2B are schematic views showing the structure of the light-emitting device according to some embodiments of the present disclosure.

As shown in FIGS. 2A and 2B, the light-emitting device comprises a plurality of light-emitting units. Here, the plurality of light-emitting units comprises a first light-emitting unit 01, a second light-emitting unit 02, and a third light-emitting unit 03. For example, the plurality of light-emitting units comprises a red light-emitting unit R, a green light-emitting unit G, and a blue light-emitting unit B. Each light-emitting unit comprises a micro-cavity structure.

It should be understood that by adjusting the thickness (also referred to as an optical length) of the micro-cavity structure in each light-emitting unit, the interference of light of a specific wavelength can be enhanced, so that each light-emitting unit emits light with a high brightness, for example, the red light unit R can emit red light with a high brightness, the green light-emitting unit G can emit green light with a high brightness, and the blue light-emitting unit B can emit blue light with a high brightness.

As shown in FIGS. 2A and 2B, the micro-cavity structure of each light-emitting unit comprises an anode 11, a hole transport layer 12, a functional layer 13, and a cathode 14. In some embodiments, the micro-cavity structure of each light-emitting unit further comprises an electron transport layer 15 between the functional layer 13 and the cathode 14.

For example, the anode 11 comprises a first metal oxide layer, a second metal oxide layer, and a metal layer located between the first metal oxide layer and the second metal oxide layer. In some embodiments, the materials of the first metal oxide layer and the second metal oxide layer are the same. For example, the material of each of the first metal oxide layer and the second metal oxide layer comprise indium tin oxide (ITO) or the like. For example, the material of the metal layer comprises silver and the like.

The hole transport layer 12 is located on one side of the anode 11. It should be understood that although FIGS. 2A and 2B show that the hole transport layers 12 in different light-emitting units are spaced apart from each other, this is not restrictive. For example, the hole transport layers 12 in different light-emitting units can be provided integrally, that is, the hole transport layers 12 in different light-emitting units are continuous.

The functional layer 13 is located on one side of the hole transport layer 12 away from the anode 11. It should be understood that the functional layer 13 at least comprises a light-emitting layer, for example, a first light-emitting layer EL1, a second light-emitting layer EL2, or a third light-emitting layer EL3.

Here, the functional layer 13 of the first light-emitting unit 01 comprises a first light-emitting layer EL1, a first buffer layer BL1, and a second buffer layer BL2. For example, the first light-emitting unit 01 is one of the red light-emitting unit R and the green light-emitting unit G. For example, as shown in FIG. 2A, the functional layer 13 of the red light-emitting unit R comprises the first light-emitting layer EL1, the first buffer layer BL1, and the second buffer layer BL2. For another example, as shown in FIG. 2B, the functional layer 13 of the green light-emitting unit R comprises the first light-emitting layer EL1, the first buffer layer BL1, and the second buffer layer BL2.

The first light-emitting layer EL1 may comprise, for example, an organic light-emitting layer. The first buffer layer BL1 is located between the first light-emitting layer EL1 and the hole transport layer 12 of the first light-emitting unit 01, and the second buffer layer BL2 is located between the first buffer layer BL1 and the first light-emitting layer EL1. Here, the material of the second buffer layer BL2 is different from that of the first buffer layer BL1. In addition, the physical thickness of the second buffer layer BL2 is less than or equal to 30 nanometers, and the optical thickness of the second buffer layer BL2 is less than or equal to 60 nanometers. It should be understood that the physical thickness and optical thickness of the second buffer layer BL2 are both greater than 0 nanometer.

For example, the absolute value of the difference between the band gap of the first buffer layer BL1 and the band gap of the second buffer layer BL2 is a first value. The first value is less than or equal to 0.2 eV, for example, 0.05 eV, 0.1 eV, 0.15 eV, etc. In this way, the barrier for carriers to enter the first light-emitting layer EL1 can be reduced, which helps to improve the light-emitting efficiency of the first light-emitting layer EL1.

In some embodiments, the materials of the first buffer layer BL1 and the second buffer layer BL2 comprise organic material, such as aromatic compound. As some implementations of aromatic compound, the materials of the first buffer layer BL1 and the second buffer layer BL2 may comprise poly-phenylene vinylenes, polythiophenes, polysilanes, triphenylmethanes, triarylamines, hydrazones, pyrazolines, azoles, carbazoles, butadiene materials or the like.

The cathode 14 is located on one side of the functional layer 13 away from the hole transport layer 12. The material of the cathode 14 may comprise semi-transmission material, for example, magnesium silver alloy (MgAg), indium zinc oxide (IZO), or the like. It should be understood that although FIGS. 2A and 2B show that the cathodes 14 in different light-emitting units are spaced apart from each other, this is not restrictive. For example, the cathodes 14 in different light-emitting units can be provided integrally, that is, different light-emitting units share one cathode.

In the above embodiments, the functional layer 13 of the first light-emitting unit 01 comprises a first buffer layer BL1 and a second buffer layer BL2 of different materials. Moreover, the physical thickness of the second buffer layer BL2 is less than or equal to 30 nanometers, and the optical thickness of the second buffer layer BL2 is less than or equal to 60 nanometers. Such a light-emitting device is favorable for improving the luminous efficiency of the first light-emitting unit whilst improving the luminous efficiency of at least one of the second light-emitting unit 02 or the third light-emitting unit 03, so that the luminous efficiency of the white light of the light-emitting device can be improved.

In one or more embodiments, the refractive index of the hole transport layer 12 ranges from 1.4 to 2.2, for example, is 1.5, 1.6, 1.8, 1.9, etc. As some implementations, the refractive index of the hole transport layer 12 ranges from 1.4 to 1.8. In this way, the luminous efficiency of the red light-emitting unit R and the luminous efficiency of the green light-emitting unit G can be further improved while the luminous efficiency of the blue light-emitting unit B is improved.

In some embodiments, referring to FIGS. 2A and 2B, the functional layer 13 of the second light-emitting unit 02 comprises a second light-emitting layer EL2 and a third buffer layer BL3. In other embodiments, the functional layer 13 of the second light-emitting unit 02 may further comprise a fourth buffer layer BL4, which will be described below in conjunction with FIGS. 3A and 3B.

Figure 3A:
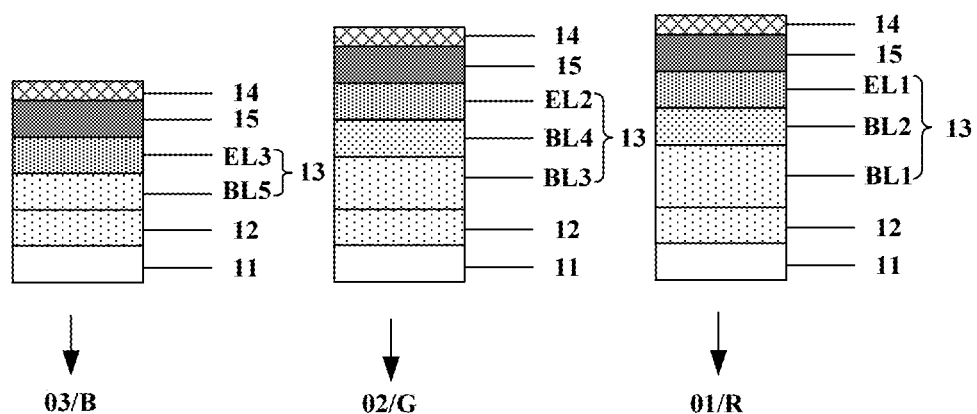
FIGS. 3A and 3B are schematic views showing the structure of the light-emitting device according to other embodiments of the present disclosure.
Figure 3B:
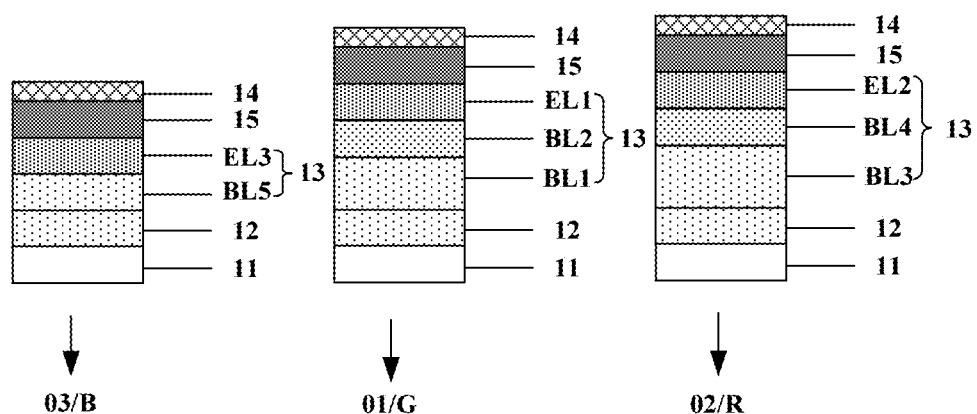

FIGS. 3A and 3B are schematic views showing the structure of the light-emitting device according to other embodiments of the present disclosure.

As shown in FIGS. 3A and 3B, the functional layer 13 of the first light-emitting unit 01 comprises a first light-emitting layer EL1, a first buffer layer BL1, and a second buffer layer BL2, and the functional layer 13 of the second light-emitting unit 02 comprises a second light-emitting layer EL2, a third buffer layer BL3, and a fourth buffer layer BL4.

For example, as shown in FIG. 3A, the functional layer 13 of the red light-emitting unit R comprises a first light-emitting layer EL1, a first buffer layer BL1, and a second buffer layer BL2, and the functional layer 13 of the green light-emitting unit G comprises a second light-emitting layer EL2, a third buffer layer BL3 and a fourth buffer layer BL4. For another example, as shown in FIG. 3B, the functional layer 13 of the green light-emitting unit G comprises a first light-emitting layer EL1, a first buffer layer BL1 and a second buffer layer BL2, and the functional layer 13 of the red light-emitting unit R comprises a second light-emitting layer EL2, a third buffer layer BL3, and a fourth buffer layer BL4.

The third buffer layer BL3 is located between the second light-emitting layer EL2 and the hole transport layer 12 of the second light-emitting unit 02, and the fourth buffer layer BL4 is located between the third buffer layer BL3 and the second light-emitting layer EL2. Here, the material of the fourth buffer layer BL4 is different from that of the third buffer layer BL3. In addition, the physical thickness of the fourth buffer layer BL4 is less than or equal to 30 nanometers, and the optical thickness of the fourth buffer layer BL4 is less than or equal to 60 nanometers. It should be understood that the physical thickness and optical thickness of the fourth buffer layer BL4 are both greater than 0 nanometer.

For example, the absolute value of the difference between the band gap of the third buffer layer BL3 and the band gap of the fourth buffer layer BL4 is a second value. The second value is less than or equal to 0.2 eV, for example, 0.05 eV, 0.1 eV, 0.15 eV, etc. In this way, the barrier for carriers to enter the second light-emitting layer EL2 can be reduced, which helps to improve the light-emitting efficiency of the second light-emitting layer EL2.

In one or more embodiments, the first value and the second value are both less than or equal to 0.2 eV. In this way, the barriers for carriers to enter the first light-emitting layer EL1 and the second light-emitting layer EL2 can be reduced, which helps to improve the luminous efficiency of the first light-emitting layer EL1 and the luminous efficiency of the second light-emitting layer EL2.

In some embodiments, the materials of the third buffer layer BL3 and the fourth buffer layer BL4 comprise organic material, such as aromatic compound. As some implementations of aromatic compound, the materials of the third buffer layer BL3 and the fourth buffer layer BL4 may comprise poly-phenylene vinylenes, polythiophenes, polysilanes, triphenylmethanes, triarylamines, hydrazones, pyrazolines, azoles, carbazoles, butadiene materials or the like.

In the above embodiments, the functional layer 13 of the first light-emitting unit 01 comprises a first buffer layer BL1 and a second buffer layer BL2 of different materials, and the functional layer 13 of the second light-emitting unit 02 comprises a third buffer layer BL3 and a fourth buffer layer BL4 of different materials. Moreover, the physical thickness of each of the second buffer layer BL2 and the fourth buffer layer BL4 is less than or equal to 30 nanometers, and the optical thickness of each of the second buffer layer BL2 and the fourth buffer layer BL4 is less than or equal to 60 nanometers. Such a light-emitting device is favorable for improving the light-emitting efficiency of the first light-emitting unit 01 and the light-emitting efficiency of the second light-emitting unit 02 whilst improving the light-emitting efficiency of the third light-emitting unit 03, so that the light-emitting efficiency of the white light of the light-emitting device can be further improved.

In some embodiments, the physical thickness of at least one of the second buffer layer BL2 or the fourth buffer layer BL4 is greater than or equal to 5 nanometers and less than or equal to 30 nanometers. In this way, the stability of the performance of at least one of the second buffer layer BL2 or the fourth buffer layer BL4 can be ensured, so that the reliability of the light-emitting device can be improved on the premise of facilitating improving the luminous efficiency of the white light of the light-emitting device.

In some embodiments, the materials of the second buffer layer BL2 and the fourth buffer layer BL4 are the same. In this way, the second buffer layer BL2 and the fourth buffer layer BL4 may be formed through a same process (for example, an evaporation process), which helps to facilitate simplifying the process and saving the cost in a case where the luminous efficiency of the first light-emitting unit 01 and the luminous efficiency of the second light-emitting unit 02 are improved.

In some embodiments, the material of at least one of the first buffer layer BL1 or the third buffer layer BL3 is the same as that of the hole transport layer 12. Under such a structure, no new interface barrier will be introduced between the hole transport layer 12 and at least one of the first buffer layer BL1 or the third buffer layer BL3, thereby facilitating reducing the loss of excitons, and further improving the luminous efficiency of the light-emitting device.

In some embodiments, referring to FIGS. 2A-2B and FIGS. 3A-3B, the functional layer 13 of the third light-emitting unit 03 (for example, the blue light-emitting unit B) comprises a third light-emitting layer EL3 and a fifth buffer layer BL5. Here, the fifth buffer layer BL5 is located between the third light-emitting layer EL3 and the hole transport layer 12 of the third light-emitting unit 03.

According to one or more embodiments of the present disclosure, the fifth buffer layer BL5 is in contact with the third light-emitting layer EL3, and the fifth buffer layer BL5 is in contact with the hole transport layer 12 of the third light-emitting unit 03. In other words, there is no additional layer between the third light-emitting layer EL3 and the hole transport layer 12 except for the fifth buffer layer BL5. For example, the material of the fifth buffer layer BL5 comprises organic material, such as aromatic compound.

In some embodiments, the material of the fifth buffer layer BL5 is the same as that of the hole transport layer 12. Under such a structure, no new interface barrier is introduced between the fifth buffer layer BL5 and the hole transport layer 12, thereby facilitating reducing the loss of excitons, and further improving the luminous efficiency of the light-emitting device.

For the micro-cavity structure, in a case of m×λ/2=L, the interference between the light emitted by the light-emitting layer in each light-emitting unit and the light reflected by the anode is enhanced. Here, m is a positive integer, λ is a wavelength of light emitted by the light-emitting layer, and L is a thickness of the micro-cavity structure. For example, the wavelength of red light emitted by the light-emitting layer in the red light-emitting unit R is around 620 nm, the wavelength of green light emitted by the light-emitting layer in the green light-emitting unit G is around 530 nm, and the wavelength of the blue light emitted by the light-emitting layer of the blue light-emitting unit B is around 460 nm. It can be seen that, in order to obtain red light, green light and blue light of higher brightness, the thicknesses of the micro-cavity structures in the red light-emitting unit R, the green light-emitting unit G, and the blue light-emitting unit B are different.

In some embodiments, the thicknesses of the functional layer 13 of the first light-emitting unit 01, the functional layer 13 of the second light-emitting unit 02, and the functional layer 13 of the third light-emitting unit 03 are different from each other, so that the thicknesses of the micro-cavity structure in the first light-emitting unit 01, the micro-cavity structure in the second light-emitting unit 02, and the micro-cavity structure in the third light-emitting unit 03 are different from each other. For example, the thicknesses of other layers than the functional layer 13 in the micro-cavity structures of different light-emitting units may be the same. In other words, due to the difference of the thicknesses of the functional layers 13 in the micro-cavity structures of different light-emitting units, the thicknesses of the micro-cavity structures of different light-emitting units are different.

As some implementations, referring to FIGS. 2A and 3A, the sum of the thicknesses of the first buffer layer BL1 and the second buffer layer BL2 in the red light-emitting unit R is greater than the sum of the thicknesses of the third buffer layer BL3 and the fourth buffer layer BL4 in the green light-emitting unit G, and the sum of the thicknesses of the third buffer layer BL3 and the fourth buffer layer BL4 in the green light-emitting unit G is greater than the thickness of the fifth buffer layer BL5 in the blue light-emitting unit B.

For example, the sum of the thicknesses of the first buffer layer BL1 and the second buffer layer BL2 in the red light-emitting unit R is greater than or equal to 80 nm. The sum of the thicknesses of the third buffer layer BL3 and the fourth buffer layer BL4 in the green light-emitting unit G is greater than or equal to 50 nm.

Table 2 shows the luminous efficiency R-eff ratio of the red light-emitting unit R, the luminous efficiency G-eff ratio of the green light-emitting unit G, the B-eff ratio of the blue light-emitting unit B and the luminous efficiency W-eff ratio of the white light of the light-emitting device under different conditions obtained by a simulation software (for example, setfos optical simulation software).

TABLE 2

| Conditions | B-eff ratio | G-eff ratio | R-eff ratio | W-eff ratio |
| --- | --- | --- | --- | --- |
| Reference conditions | 100% | 100% | 100% | 100% |
| Condition 1 | 102.50% | 96.99% | 98.46% | 98.60% |
| Condition 2 | 96.60% | 102.01% | 101.64% | 97.92% |
| Condition 3 | 102.50% | 103.95% | 102.71% | 103.20% |

Under reference conditions: the refractive index of the hole transport layer 12 is a reference refractive index; the functional layer 13 of one of the red light-emitting unit R and the green light-emitting unit G comprises the first buffer layer BL1 and does not comprise the second buffer layer BL2, and the functional layer 13 of the other of the red light-emitting unit R and the green light-emitting unit G comprises the third buffer layer BL3 but does not comprise the fourth buffer layer BL4; and the functional layer 13 of the blue light-emitting unit B comprises the fifth buffer layer BL5.

Under condition 1: the refractive index of the hole transport layer 12 is less than the reference refractive index. Other conditions are the same as that of the reference conditions.

Under condition 2: the refractive index of the hole transport layer 12 is greater than the reference refractive index. Other conditions are the same as that of the reference conditions.

Under condition 3: the refractive index of the hole transport layer 12 is less than the reference refractive index; the functional layer 13 of one of the red light-emitting unit R and the green light-emitting unit G comprises the first buffer layer BL1 and the second buffer layer BL2, and the functional layer 13 of the other of the red light-emitting unit R and the green light-emitting unit G comprises a third buffer layer BL3 and a fourth buffer layer BL4; and the functional layer 13 of the blue light-emitting unit B comprises the fifth buffer layer BL5.

In addition, under each condition, the thickness of the micro-cavity structure of each light-emitting unit satisfies the interference enhancement condition mentioned above.

It can be seen from Table 2 that under condition 4, the solutions provided by some embodiments of the present disclosure can not only improve the luminous efficiency of the blue light-emitting unit B, but also can improve the luminous efficiency of the red light-emitting unit R and the luminous efficiency of the green light-emitting unit G at the same time, thereby improving the luminous efficiency of the white light of the light-emitting device in a case where the refractive index of the hole transport layer 12 is small.

In the embodiments of the present disclosure, a manufacturing method of a light-emitting device is also provided. The manufacturing method comprises the step of forming a plurality of light-emitting units. Here, the plurality of light-emitting units comprises a first light-emitting unit, a second light-emitting unit, and a third light-emitting unit, and each of the plurality of light-emitting units comprises a micro-cavity structure.

Figure 4A:
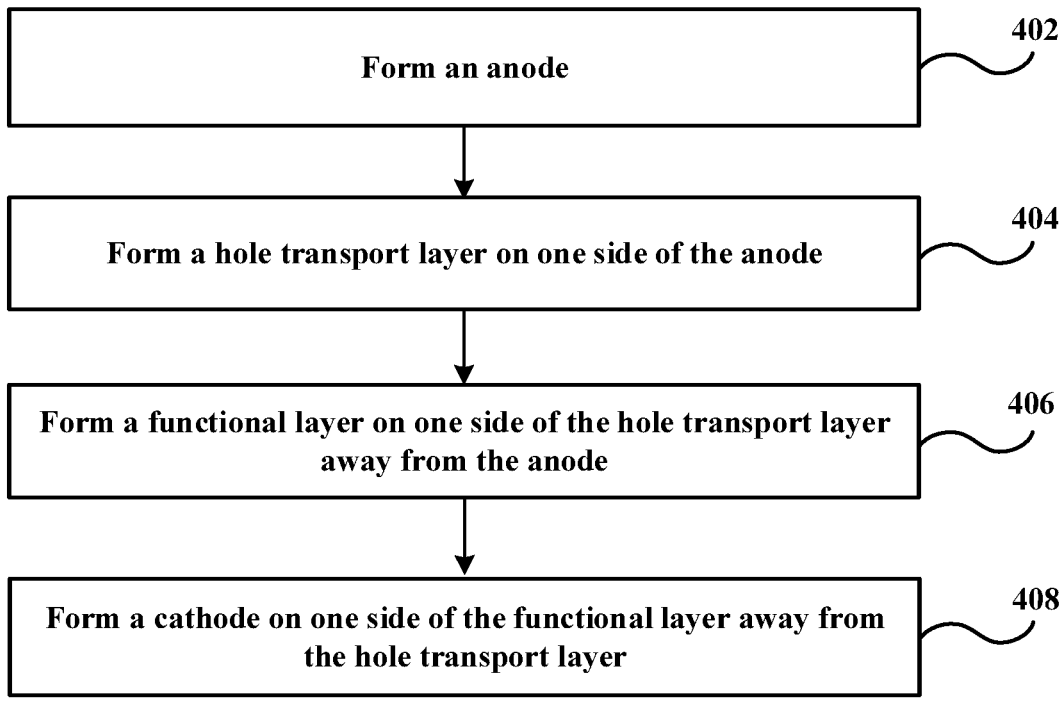
FIG. 4A is a schematic flow chart of forming a microcavity structure in a manufacturing method of a light-emitting device according to an embodiment of the present disclosure.
Figure 4B:
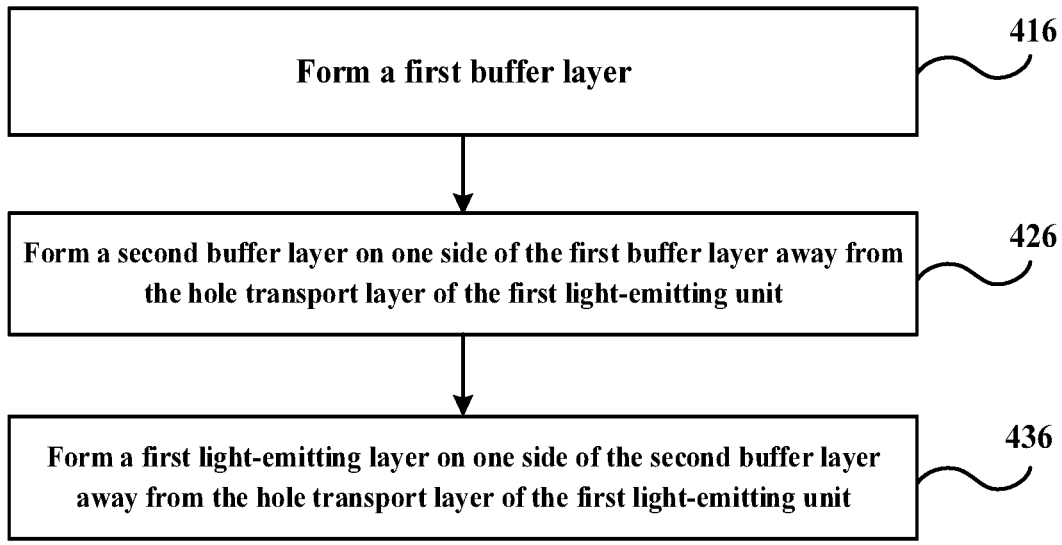
FIG. 4B is a schematic flow chart of forming a functional layer of a first light-emitting unit according to an embodiment of the present disclosure.

FIG. 4A is a schematic flow chart of forming a micro-cavity structure in a manufacturing method of a light-emitting device according to an embodiment of the present disclosure. FIG. 4B is a schematic flow chart of forming a functional layer of a first light-emitting unit according to an embodiment of the present disclosure. For example, the first light-emitting unit is one of the red light-emitting unit and the green light-emitting unit.

As shown in FIG. 4A, the process of forming the micro-cavity structure comprises step 402 to step 408.

At step 402, an anode is formed. For example, an anode may be formed on one side of a backplane. Here, a driving circuit for driving the light-emitting device to emit light may be formed in the backplane.

For example, an anode material layer may be formed first, and then the anode material layer is patterned to obtain patterned anode.

At step 404, a hole transport layer is formed on one side of the anode.

For example, the hole transport layer may be formed by processes such as evaporation, spin coating, or printing. For example, the thickness of the hole transport layer is greater than or equal to 100 nanometers.

At step 406, a functional layer is formed on one side of the hole transport layer away from the anode.

It should be understood that for different light-emitting units, functional layers corresponding to the light-emitting units may be formed. The process of forming the functional layer of the first light-emitting unit will be described later in conjunction with FIG. 4B.

At step 408, a cathode is formed on one side of the functional layer away from the hole transport layer.

As shown in FIG. 4B, the process of forming the functional layer of the first light-emitting unit may comprise step 416 to step 436.

At step 416, a first buffer layer is formed.

For example, the first buffer layer may be formed by processes such as evaporation, chemical vapor deposition, spin coating, inkjet printing, or printing.

At step 426, a second buffer layer is formed on one side of the first buffer layer away from the hole transport layer of the first light-emitting unit.

Similarly, for example, the second buffer layer may be formed by processes such as evaporation, chemical vapor deposition, spin coating, inkjet printing, or printing.

Here, the material of the second buffer layer is different from that of the first buffer layer, the physical thickness of the second buffer layer is less than or equal to 30 nanometers, and the optical thickness of the second buffer layer is less than or equal to 60 nanometers.

At step 436, a first light-emitting layer is formed on one side of the second buffer layer away from the hole transport layer of the first light-emitting unit.

For example, the first light-emitting layer may be formed by an evaporation process or the like.

In the light-emitting device formed in the above embodiments, the functional layer of the first light-emitting unit comprises a first buffer layer and a second buffer layer of different materials, the physical thickness of the second buffer layer is less than or equal to 30 nanometers, and the optical thickness of the second buffer layer is less than or equal to 60 nanometers. Such a light-emitting device is favorable for improving the light-emitting efficiency of the first light-emitting unit whilst improving the light-emitting efficiency of at least one of the second light-emitting unit or the third light-emitting unit, so that the light-emitting efficiency of the white light of the light-emitting device may be improved.

In the embodiments of the present disclosure, a display panel is also provided. The display panel comprises a plurality of pixel units, each pixel unit may comprise the light-emitting device according to any one of the above embodiments.

In the embodiments of the present disclosure, a display device is also provided. The display device comprises the display panel according to any one of the above embodiments. In some embodiments, the display device may be any product or member having a display function, such as a mobile terminal, a television, a display (for example, a micro-display), a notebook computer, a digital photo frame, a navigator, or an electronic paper.

Hereto, various embodiments of the present disclosure have been described in detail. Some details well known in the art are not described to avoid obscuring the concept of the present disclosure. According to the above description, those skilled in the art would fully know how to implement the technical solutions disclosed herein.

Although some specific embodiments of the present disclosure have been described in detail by way of examples, those skilled in the art should understand that the above examples are only for the purpose of illustration and are not intended to limit the scope of the present disclosure. It should be understood by those skilled in the art that modifications to the above embodiments and equivalently substitution of part of the technical features can be made without departing from the scope and spirit of the present disclosure. The scope of the disclosure is defined by the following claims.

What is claimed is:

1. A light-emitting device comprising a plurality of light-emitting units, the plurality of light-emitting units comprising a first light-emitting unit, a second light-emitting unit, and a third light-emitting unit, wherein:
   each of the plurality of light-emitting units comprises a micro-cavity structure which comprises:
   an anode,
   a hole transport layer located on one side of the anode,
   a functional layer located on one side of the hole transport layer away from the anode, and
   a cathode located on one side of the functional layer away from the hole transport layer; and
   wherein the functional layer of the first light-emitting unit comprises:
   a first light-emitting layer,
   a first buffer layer located between the first light-emitting layer and the hole transport layer of the first light-emitting unit, and a second buffer layer located between the first buffer layer and the first light-emitting layer, wherein a material of the second buffer layer is different from that of the first buffer layer, a physical thickness of the second buffer layer is less than or equal to 30 nanometers, and an optical thickness of the second buffer layer is less than or equal to 60 nanometers; and wherein the functional layer of the third light-emitting unit comprises:

a third light-emitting layer, and a fifth buffer layer located between the third light-emitting layer and the hole transport layer of the third light-emitting unit, wherein a material of at least one of the first buffer layer or the fifth buffer layer is same as that of the hole transport layer.

2. The light-emitting device according to claim 1, wherein the functional layer of the second light-emitting unit comprises:

a second light-emitting layer;

a third buffer layer located between the second light-emitting layer and the hole transport layer of the second light-emitting unit; and a fourth buffer layer located between the third buffer layer and the second light-emitting layer, wherein a material of the fourth buffer layer is different from that of the third buffer layer, a physical thickness of the fourth buffer layer is less than or equal to 30 nanometers, and an optical thickness of the fourth buffer layer is less than or equal to 60 nanometers.

3. The light-emitting device according to claim 2, wherein a material of the hole transport layer of the second light-emitting unit is same as that of the third buffer layer.

4. The light-emitting device according to claim 2, wherein the physical thickness of at least one of the second buffer layer or the fourth buffer layer is greater than or equal to 5 nanometers.

5. The light-emitting device according to claim 2, wherein the first light-emitting unit is one of a red light-emitting unit and a green light-emitting unit, the second light-emitting unit is another of the red light-emitting unit and the green light-emitting unit, and the third light-emitting unit is a blue light-emitting unit.

6. The light-emitting device according to claim 2, wherein an absolute value of a difference between a band gap of the first buffer layer and a band gap of the second buffer layer is a first value, an absolute value of a difference between a band gap of the third buffer layer and a band gap of the fourth buffer layer is a second value, and at least one of the first value or the second value is less than or equal to 0.2 eV.

7. The light-emitting device according to claim 2, wherein a material of the second buffer layer is same as that of the fourth buffer layer.

8. The light-emitting device according to claim 2, wherein a material of each of the first buffer layer, the second buffer layer, the third buffer layer, and the fourth buffer layer comprises an organic material.

9. The light-emitting device according to claim 8, wherein the organic material comprises an aromatic compound.

10. The light-emitting device according to claim 1, wherein the fifth buffer layer is in contact with the third light-emitting layer, and in contact with the hole transport layer of the third light-emitting unit.

11. The light-emitting device according to claim 1, wherein a material of the fifth buffer layer is same as that of the hole transport layer of the third light-emitting unit" after "hole transport layer.

12. The light-emitting device according to claim 1, wherein a refractive index of the hole transport layer of the first light-emitting unit is between 1.4 to 2.2.

13. The light-emitting device according to claim 1, wherein thicknesses of the functional layer of the first light-emitting unit, the functional layer of the second light-emitting unit and the functional layer of the third light-emitting unit are different from each other, such that thicknesses of the micro-cavity structure in the first light-emitting unit, the micro-cavity structure in the second light-emitting unit and the micro-cavity structure in the third light-emitting unit are different from each other.

14. The light-emitting device according to claim 1, wherein the micro-cavity structure further comprises:

an electron transport layer located between the functional layer and the cathode.

15. The light-emitting device according to claim 1, wherein a material of the fifth buffer layer comprises an organic material.

16. A display panel comprising a plurality of pixel units, wherein each of the plurality of pixel units comprises the light-emitting device according to claim 1.

17. A display device comprising the display panel according to claim 16.

18. A light-emitting device comprising a plurality of light-emitting units, the plurality of light-emitting units comprising a first light-emitting unit, a second light-emitting unit, and a third light-emitting unit, wherein:

each of the plurality of light-emitting units comprises a micro-cavity structure which comprises:

an anode, a hole transport layer located on one side of the anode, wherein a refractive index of the hole transport layer is between 1.4 to 1.8, a functional layer located on one side of the hole transport layer away from the anode, and a cathode located on one side of the functional layer away from the hole transport layer; wherein the functional layer of the first light-emitting unit comprises:

a first light-emitting layer, a first buffer layer located between the first light-emitting layer and the hole transport layer of the first light-emitting unit, and a second buffer layer located between the first buffer layer and the first light-emitting layer, wherein a material of the second buffer layer is different from that of the first buffer layer, a physical thickness of the second buffer layer is less than or equal to 30 nanometers, and an optical thickness of the second buffer layer is less than or equal to 60 nanometers.

19. A light-emitting device comprising a plurality of light-emitting units, the plurality of light-emitting units comprising a first light-emitting unit, a second light-emitting unit, and a third light-emitting unit, wherein:

each of the plurality of light-emitting units comprises a micro-cavity structure which comprises:

an anode, a hole transport layer located on one side of the anode, a functional layer located on one side of the hole transport layer away from the anode, and a cathode located on one side of the functional layer away from the hole transport layer;

wherein the functional layer of the first light-emitting unit comprises:

a first light-emitting layer, a first buffer layer located between the first light-emitting layer and the hole transport layer of the first light-emitting unit, and a second buffer layer located between the first buffer layer and the first light-emitting layer, wherein a material of the second buffer layer is different from that of the first buffer layer, a physical thickness of the second buffer layer is less than or equal to 30 nanometers, and an optical thickness of the second buffer layer is less than or equal to 60 nanometers;

wherein the functional layer of the second light-emitting unit comprises:

a second light-emitting layer, a third buffer layer located between the second light-emitting layer and the hole transport layer of the second light-emitting unit, and a fourth buffer layer located between the third buffer layer and the second light-emitting layer, wherein a material of the fourth buffer layer is different from that of the third buffer layer, a physical thickness of the fourth buffer layer is less than or equal to 30 nanometers, and an optical thickness of the fourth buffer layer is less than or equal to 60 nanometers, wherein an absolute value of a difference between a band gap of the first buffer layer and a band gap of the second buffer layer is a first value, an absolute value of a difference between a band gap of the third buffer layer and a band gap of the fourth buffer layer is a second value, and at least one of the first value or the second value is less than or equal to 0.2 eV.

* * * * *